United States Patent [19]

Horowitz

[11] 4,318,830

[45] Mar. 9, 1982

[54] THICK FILM CONDUCTORS HAVING IMPROVED AGED ADHESION

[75] Inventor: Samuel J. Horowitz, Snyder, N.Y.

[73] Assignee: E. I. Du Pont de Nemours and Company, Wilmington, Del.

[21] Appl. No.: 3,196

[22] Filed: Jan. 15, 1979

[51] Int. Cl.$^3$ ............................................. H01B 1/06
[52] U.S. Cl. .................................. 252/519; 252/514; 252/518; 106/1.14; 106/1.15
[58] Field of Search ............... 252/514, 513, 518, 519; 106/1.12, 1.13, 1.14, 1.15, 1.19, 1.21, 47 R, 54; 428/210, 901

[56] References Cited

U.S. PATENT DOCUMENTS

| | | | |
|---|---|---|---|
| 4,016,308 | 4/1977 | Frazee | 252/519 X |
| 4,050,048 | 9/1977 | Frazee | 252/514 X |
| 4,076,894 | 2/1978 | Langley | 252/514 |
| 4,090,009 | 5/1978 | Horowitz | 252/514 |
| 4,097,653 | 6/1978 | Patterson et al. | 252/519 |
| 4,110,124 | 8/1978 | Robertson et al. | 252/514 |

*Primary Examiner*—Benjamin R. Padgett
*Assistant Examiner*—J. L. Barr

[57] ABSTRACT

Thick film conductors for hybrid microelectronic applications, having improved aged adhesion on various substrates such as 96% $Al_2O_3$ and BeO, are provided. The improved aged adhesion at the solder joints is a result of the incorporation of cobalt-based additives into the inorganic binder.

8 Claims, No Drawings

THICK FILM CONDUCTORS HAVING IMPROVED AGED ADHESION

TECHNICAL FIELD

This invention relates to thick film conductor compositions and more particularly to thick film Pd/Ag and Pt/Ag conductor compositions containing cobalt-based additive for improved aged adhesion.

BACKGROUND ART

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the printed film, the metallic component of the composition provides the functional (conductive) utility, while the inorganic binder (e.g., glass, $Bi_2O_3$, etc.) bonds the metal particles to one another and to the substrate. Thick film techniques are contrasted with thin film techniques which involve deposition of particles by evaporation or sputtering. Thick film techniques are generally discussed in "Handbook of Materials and Processes for Electronics," C. A. Harper, Editor, McGraw-Hill, N.Y., 1970, Chapter 12.

The most commonly used conductor compositions employ noble metals, especially gold, silver, platinum, palladium, and their mixtures and alloys, since their relatively inert characteristics permit firing in air.

There is a distinct commercial need for noble metal-based thick film conductor compositions for hybrid microelectronic applications which afford solder joints which retain their strength during storage at elevated temperatures.

DISCLOSURE OF THE INVENTION

The thick film conductor composition of this invention consists essentially of:

(A) 75-90 parts by weight, based on the weight of (A) plus (B) plus (C), of a conductor phase composed of silver powder in admixture with platinum or palladium, wherein the ratio of Ag to Pt is in the range of from 2.5:1 to 12:1 and the ratio of Ag to Pd is in the range of from 2.5:1 to 12:1;

(B) 9-20 parts by weight, based on the weight of (A) plus (B) plus (C), of an inorganic binder;

(C) 0.5-6 parts by weight, based on the weight of (A) plus (B) plus (C), of cobalt oxide or cobalt oxide precursor additive; and (D) organic vehicle wherein the ratio of the sum of (A) plus (B) plus (C) to the vehicle is in the range of 2:1 to 10:1 by weight.

DESCRIPTION OF THE INVENTION

The thick film conductor composition of this invention contains a noble metal conductor phase comprising 75-90 parts by weight of the combined inorganic solids content.

The conductor phase is composed of silver in admixture with either platinum or palladium. The silver powder utilized has a surface area in the range of 0.75-1.65 $m^2/g$, with specific compositions containing silver powder having several surface area values, for example, 1.2 $m^2/g$, 1.4 $m^2/g$, 1.6 $m^2/g$, 0.75-1.35 $m^2/g$.

The palladium powder utilized is in the 7-11 $m^2/g$ surface area range, with specific compositions containing Pd having the following surface area values ($m^2/g$): 8.3, 9.3, 9.5, 9.9.

The platinum powder utilized in the conductor composition of this invention has a surface area range of 15-25 $m^2/g$.

The noble metal conductor phase can be a Ag/Pd mixture in a weight ratio range of from 2.5:1 to 12:1 with different ratios such as 2.5:1, 4:1, 6:1, 8:1, 10:1, and 12:1 being preferred depending on the final application.

The noble metal conductor phase can also be a Ag/Pt mixture in a weight ratio range of from 2.5:1 to 12:1 with different ratios such as 4:1, 8:1 being preferred depending on the final application.

The composition of this invention contains 9-20 parts by weight of the combined inorganic solids content of an inorganic binder.

Any conventional electronic glass powder may be used as the inorganic binder in the compositions of the present invention, as known to those skilled in the art, including, for example, those of Larson and Short U.S. Pat. No. 2,822,279 (issued Feb. 4, 1958); Short U.S. Pat. No. 2,819,170 (issued Jan. 7, 1958); etc. Preferred glasses are shown in the tabulation below; the oxide components are given in weight percentages:

|  | Glasses | | |
| --- | --- | --- | --- |
|  | A | B | C |
| PbO | 43.6 | 10.9 | 0.7 |
| $SiO_2$ | 37.5 | 9.3 | 20.0 |
| $B_2O_3$ | 4.8 | 1.3 | 27.1 |
| $Al_2O_3$ | 4.4 | 1.0 | 6.0 |
| CaO | 9.7 | 2.4 | 4.0 |
| $Bi_2O_3$ |  | 75.1 | — |
| ZnO |  |  | 28.3 |
| BaO |  |  | 0.8 |
| $Na_2O$ |  |  | 8.9 |
| $ZrO_2$ |  |  | 4.2 |

Glass B is especially preferred.

The glass binders are prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. In this work, the peak temperature is in the range 1100°-1500° C., usually 1200°-1400° C. The melt is then quenched by cooling the melt, typically by pouring onto a cold belt or into cold running water. Particle size reduction can then be accomplished by milling as desired.

The inorganic binder can also contain up to approximately 3 parts by weight of a pyrochlore-related oxide having the general formula

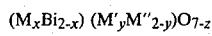

$$(M_xBi_{2-x})(M'_yM''_{2-y})O_{7-z}$$

wherein

M is selected from the group consisting of yttrium, thallium, indium, cadmium, lead, copper and the rare earth metals;

M' is selected from the group consisting of platinum, titanium, chromium, rhodium and antimony;

M" is ruthenium, iridium or mixtures thereof;

x is 0-2 with the proviso that, for monovalent copper, $x \leq 1$;

y is 0-0.5 with the proviso that y is 0-1 when M' is either rhodium or more than one of platinum, titanium, chromium, rhodium and antimony; and z is 0-1 with the proviso that it is at least equal to approximately x/2 when M is divalent lead or cadmium.

These pyrochlore materials have been described in detail in R. J. Bouchard, U.S. Pat. No. 3,583,931, issued June 8, 1971, hereby incorporated by reference. These pyrochlore materials act as adhesion promoters for the compositions of this invention; copper bismuth ruthenate, $Cu_{0.5}Bi_{1.5}Ru_2O_{6.5}$, is preferred.

The conductor composition of this invention contains 0.5-6 parts by weight of an additive which is either a cobalt oxide such as $CoO$, $Co_2O_3$, $Co_3O_4$ or a cobalt oxide precursor, which is converted to cobalt oxide during firing, such as $CoF_2$, $CoCO_3$. On the basis of the total weight of the final paste composition, the cobalt additive is preferably present to the extent of 1% by weight.

The presence of this cobalt additive was unexpectedly found to provide improved aged adhesion of the electrode to substrates used in microcircuits. The additive is not thought to be part of the conductor phase of the instant composition but of the binder. In contrast, U.S. Pat. No. 4,097,653, issued June 27, 1978 to F. K. Patterson and J. R. Rellick describes $Co_xB_y$ (cobalt boride) conductor compositions.

The inorganic particles are dispersed in an inert liquid vehicle by mechanical mixing (e.g., on a roll mill) to form a paste-like composition. The dispersion is printed as "thick film" on conventional dielectric substrates in the conventional manner. Any inert liquid can be used as the vehicle. Any of various organic liquids, with or without thickening and/or stabilizing agents and/or other common additives, can be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle can contain or be composed of volatile liquids to promote fast setting after application to the substrate. A preferred vehicle is ethyl cellulose dissolved in dibutyl carbitol and β-terpineol. The ratio of inorganic powder solids to inert liquid organic vehicle is in the range of from 2:1 to 10:1. Within this range, the proportion of inorganic powder to vehicle is a matter of choice, depending upon the desired viscosity, but normally there is 60-80% inorganic powder and 20-40% vehicle. The compositions may, of course, be modified by the addition of other materials not affecting their beneficial characteristics.

The composition pastes of this invention are printed on dielectric substrates (glass, glass-ceramic, and ceramic) such as 96% $Al_2O_3$ and BeO and dried to remove the vehicle. Firing of the compositions of the present invention is carried out at temperatures and for times sufficient to sinter the inorganic materials and to produce conductor patterns adherent to the dielectric substrate.

The firing can be accomplished in a belt furnace, 60 minutes above room temperature and approximately 10 minutes at a peak temperature of 850° C.

Adhesion is tested as follows. Wire leads are attached to the fired conductor pads by placing a 20-gauge pretinned copper wire across three of the fired metallization pads and then dipping them in a solder pot (62Sn/36Pb/2Ag or 63Sn/37Pb as indicated in the Examples) at a temperature between 220° C. and 250° C. Bond strengths are then measured by pulling the soldered leads at 90° to the substrate with an Instron tester. Several pads are pulled for each sample to obtain a representative bond strength.

The wire peel adhesion of soldered thick film conductors to ceramic substrates is further described in Bulletin No. A-74672, E. I. du Pont de Nemours and Company, "Method of Test for Wire Peel Adhesion of Soldered Thick Film Conductors to Ceramic Substrates."

Aged adhesion is determined after the fired product had been thermally aged for specified time periods at 150° C.

Solder acceptance of the fired patterns is tested by first applying flux (Alpha 611, a mildly activated acid flux) to the fired parts, dipping the fluxed part for 10 sec. in the solder bath at the temperature indicated in the Examples, and observing the amount of soldering. "Good" solder wetting means complete solder wetting with no voids and few pinholes; "fair solder wetting shows only a few voids or unwet areas. (Alpha 611 Flux-Alpha Metals, Inc. is a mildly activated flux liquid rosin flux, water white rosin.)

Solder leach testing is carried out by dipping the fired patterns in solder flux (mildly active grade such as Alpha 611) for 10 seconds (3 sec. preheat). Remove from solder and allow to cool. Reflux and redip as above. Number of dips or cycles determined as the maximum of exposure cycles required to cause a discontinuity in solder coverage across the 0.020" line on the 200 square conductor serpentine. A more complete description of this solder leach test is given in Handbook of Thick Film Hybrid Microelectronics, C. A. Harper, Editor, McGraw Hill 1974, pp. 5/14–15.

In the Examples below, illustrating the invention (except for comparative Example 2) all parts are by weight unless otherwise indicated.

EXAMPLE 1

The composition of this Example is as follows:

| | Parts |
|---|---|
| Ag | 56 |
| Pt | 7 |
| Glass B | 12 |
| $Cu_{0.5}Bi_{1.5}Ru_2O_{6.5}$ | 2 |
| $Co_3O_4$ | 1 |
| Vehicle (93.2% of the vehicle is ethyl cellulose/dibutyl carbitol/β-terpineol// 13/43/44 by weight; 2.3% is surfactant and 4.5% is leveling agent) | 22 |

The composition is prepared and tested as described above. Adhesion data (in pounds, on BeO substrate, firing under a 30-min. profile, 10 min. at peak; 62 Sn/36 Pb/2 Ag solder pot at 220° C.) are as follows:

| | |
|---|---|
| initial | 6.2 |
| 100 hours/150° C. | 6.1 |
| 1000 hours/150° C. | 5.7 |

EXAMPLES 2-5

The compositions are shown below; Example 2, not containing a cobalt additive, is outside the scope of this invention.

|  | Example | | | |
|---|---|---|---|---|
|  | 2 | 3 | 4 | 5 |
| Ag (1.4 m$^2$/g) | 58.3 | 58.3 | 58.3 | 58.3 |
| Pd (8.3 m$^2$/g) | 9.7 | 9.7 | 9.7 | 9.7 |
| Bi$_2$O$_3$ | 9.0 | 9.0 | 9.0 | 9.0 |
| Glass A | 3.0 | 3.0 | 3.0 | 3.0 |
| CoCO$_3$ | — | 1.0 | — | — |
| Co$_3$O$_4$ | — | — | 1.0 | — |
| CoF$_2$ | — | — | — | 1.0 |

Aged adhesion, solder acceptance (SA) and solder leach resistance (SLR) data are shown below; the aged adhesion values are an average of 9-12 readings (3 per substrate):

|  |  | Example | | | |
|---|---|---|---|---|---|
| Aged Adhesion: | | 2 | 3 | 4 | 5 |
| 62 | Sn/36 Pb/2 Ag (220° C.) | | | | |
|  | 72 hours/150° C. | 4.3 | 5.3 | 5.4 | 6.0 |
|  | 210 hours/150° C. | 5.1 | 5.3 | 5.4 | 5.9 |
| 63 | Sn/37 Pd (240° C.) | | | | |
|  | 65 hours/150° C. | 3.7 | 5.0 | 5.4 | 4.2 |
| SA |  | good | good | good | good |
| SLR | (no. of dips) | 5 | 5 | 5 | 5 |

I claim:

1. A thick film conductor composition consisting essentially of:
   (A) 75-90 parts by weight, based on the weight of (A) plus (B) plus (C), of a conductor phase composed of silver powder in admixture with platinum or palladium, wherein the ratio of Ag to Pt is in the range of from 2.5:1 to 12:1 and the ratio of Ag to Pd is in the range of from 2.5:1 to 12:1;
   (B) 9-20 parts by weight, based on the weight of (A) plus (B) plus (C), of an inorganic binder;
   (C) 0.5-6 parts by weight, based on the weight of (A) plus (B) plus (C), of cobalt oxide or cobalt oxide precursor additive; and
   (D) organic vehicle wherein the ratio of the sum of (A) plus (B) plus (C) to the vehicle is in the range of 2:1 to 10:1 by weight.

2. The composition of claim 1 wherein the Ag/Pt ratio is 8:1.

3. The composition of claim 1 wherein the inorganic binder comprises a glass.

4. The composition of claim 1 wherein the inorganic binder comprises a glass and an oxide.

5. The composition of claim 1 wherein the additive is selected from the group consisting of CoO, Co$_2$O$_3$, Co$_3$O$_4$, CoF$_2$ and CoCO$_3$.

6. The composition of claim 3 or 4 wherein the inorganic binder also contains a pyrochlore-related oxide.

7. A thick film conductor composition consisting essentially of:
   (A) 75-90 parts by weight, based on the weight of (A) plus (B) plus (C), of a conductor phase composed of silver powder in admixture with platinum or palladium, wherein the ratio of Ag to Pt is in the range of from 2.5:1 to 12:1 and the ratio of Ag to Pd is in the range of from 2.5:1 to 12:1;
   (B) 9-20 parts by weight, based on the weight of (A) plus (B) plus (C), of an inorganic binder;
   (C) 0.5-6 parts by weight, based on the weight of (A) plus (B) plus (C), of an additive selected from the group consisting of Co$_3$O$_4$, CoF$_2$ and CoCO$_3$.

8. A thick film conductor composition consisting essentially of:
   (A) 63 parts by weight of the composition of a conductive phase composed of a Ag/Pt powder mixture in the ratio of 8:1;
   (B) 14 parts by weight of the composition of an inorganic binder composed of a lead alumina borosilicate bismuthate glass and Cu$_{0.5}$Bi$_{1.5}$Ru$_2$O$_{6.5}$ in the ratio of 6:1;
   (C) 1 part by weight of the composition of Co$_3$O$_4$; and
   (D) 22 parts by weight of the composition of organic vehicle.

* * * * *